US012757328B2

(12) United States Patent
Lee et al.

(10) Patent No.: US 12,757,328 B2
(45) Date of Patent: Oct. 6, 2026

(54) PRINTED CIRCUIT BOARD

(71) Applicant: SAMSUNG ELECTRO-MECHANICS CO., LTD., Suwon-si (KR)

(72) Inventors: Seung Eun Lee, Suwon-si (KR); Jung Chul Gong, Suwon-si (KR); Ki Hwan Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 207 days.

(21) Appl. No.: 18/731,933

(22) Filed: Jun. 3, 2024

(65) Prior Publication Data

US 2025/0126711 A1 Apr. 17, 2025

(30) Foreign Application Priority Data

Oct. 17, 2023 (KR) ........................ 10-2023-0138229

(51) Int. Cl.
*H05K 1/11* (2006.01)
*H05K 1/02* (2006.01)
*H05K 1/18* (2006.01)

(52) U.S. Cl.
CPC ........... *H05K 1/115* (2013.01); *H05K 1/0298* (2013.01); *H05K 1/18* (2013.01); *H05K 2201/08* (2013.01)

(58) Field of Classification Search
CPC ........ H05K 1/115; H05K 1/0298; H05K 1/18; H05K 2201/08
USPC .......................................................... 361/760
See application file for complete search history.

(56) References Cited

U.S. PATENT DOCUMENTS

| | | | |
|---|---|---|---|
| 2020/0006239 A1 | 1/2020 | Zhang et al. | |
| 2020/0335257 A1 | 10/2020 | Kodama et al. | |
| 2021/0259107 A1* | 8/2021 | Kimishima | H05K 1/116 |
| 2021/0329783 A1* | 10/2021 | Kawai | H05K 3/4602 |

FOREIGN PATENT DOCUMENTS

| | | |
|---|---|---|
| EP | 3 800 651 B1 | 9/2023 |
| JP | 2020-178004 A | 10/2020 |
| KR | 10-2021-0039965 A | 4/2021 |

* cited by examiner

*Primary Examiner* — Binh B Tran
(74) *Attorney, Agent, or Firm* — MORGAN, LEWIS & BOCKIUS LLP

(57) ABSTRACT

A printed circuit board includes a substrate with first through-portion; a magnetic layer disposed in at least a portion of the first through-portion and having a second through-portion; an electronic component having at least a portion disposed in the second through-portion; a first wiring pattern disposed on an upper surface of the magnetic layer; a second wiring pattern disposed on a lower surface of the magnetic layer; and a first through-via having at least a portion surrounded by the magnetic layer, and including a first via pattern connecting the first and second wiring patterns to each other.

24 Claims, 8 Drawing Sheets

PRINTED CIRCUIT BOARD

CROSS-REFERENCE TO RELATED APPLICATIONS

This application claims the benefit of priority to Korean Patent Application No. 10-2023-0138229 filed on Oct. 17, 2023 in the Korean Intellectual Property Office, the disclosure of which is incorporated herein by reference in its entirety.

TECHNICAL FIELD

The present disclosure relates to a printed circuit board.

BACKGROUND

Recently, to reduce a size of a semiconductor chip and to increase power efficiency, it may be necessary to embed various passive devices such as a capacitor and an inductor in a package substrate. In the case of an inductor, it may be necessary to improve inductance as compared to a general chip component by changing a material and a structure.

SUMMARY

An aspect of the present disclosure is to provide a printed circuit board which may reduce IR drop and power loss.

An aspect of the present disclosure is to provide a printed circuit board which may improve inductance.

An aspect of the present disclosure is to provide a printed circuit board which may implement size reduction and may increase integration density.

An aspect of the present disclosure is to dispose a magnetic layer on a first through-portion of a substrate, to form an inductor such as a magnetic composite inductor (MCI) on a magnetic layer, and to embed and dispose an electronic component such as a voltage regulator (VR) along with an inductor in a second through-portion of a magnetic layer.

For example, according to an example embodiment, a printed circuit board includes a substrate with first through-portion; a magnetic layer disposed in at least a portion of the first through-portion and having a second through-portion; an electronic component having at least a portion disposed in the second through-portion; a first wiring pattern disposed on an upper surface of the magnetic layer; a second wiring pattern disposed on a lower surface of the magnetic layer; and a first through-via having at least a portion surrounded by the magnetic layer, and including a first via pattern connecting the first and second wiring patterns to each other.

For example, according to an example embodiment, a printed circuit board includes a substrate having a first through-portion; a magnetic layer having at least a portion disposed in the first through-portion, in contact with the substrate, and having a second through-portion and a plurality of through-holes; a voltage regulator disposed in at least a portion of the second through-portion; an insulating layer covering at least a portion of each of the substrate, the magnetic layer, and the voltage regulator, and filling at least a portion of each of the second through-portion and the plurality of through-holes; a first wiring pattern layer disposed on an upper surface of the insulating layer; a second wiring pattern layer disposed on a lower surface of the insulating layer; and a plurality of via patterns penetrating each of the insulating layers in the plurality of through-holes.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
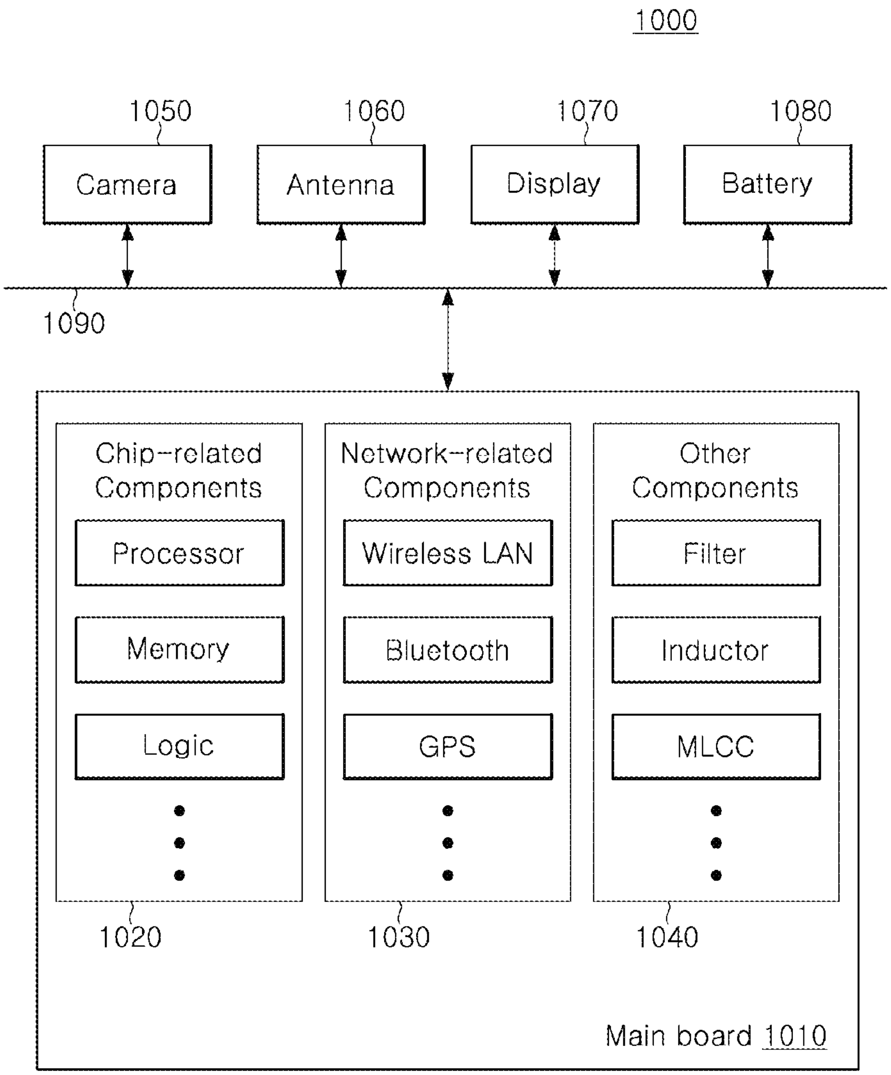
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other.

The network related components 1030 may include protocols such as wireless fidelity (Wi-Fi) (Institute of Electrical And Electronics Engineers (IEEE) 802.11 family, for microwave or the like), worldwide interoperability access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 and/or the network related components 1030 described above.

Depending on a type of the electronic device 1000, the electronic device 1000 may include other components which may or may not be physically or electrically connected to the mainboard 1010. The other components may include, for example, a camera module 1050, an antenna module 1060, a display 1070, and a battery 1080. However, the other components are not limited thereto, and may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. The other components may also include other components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
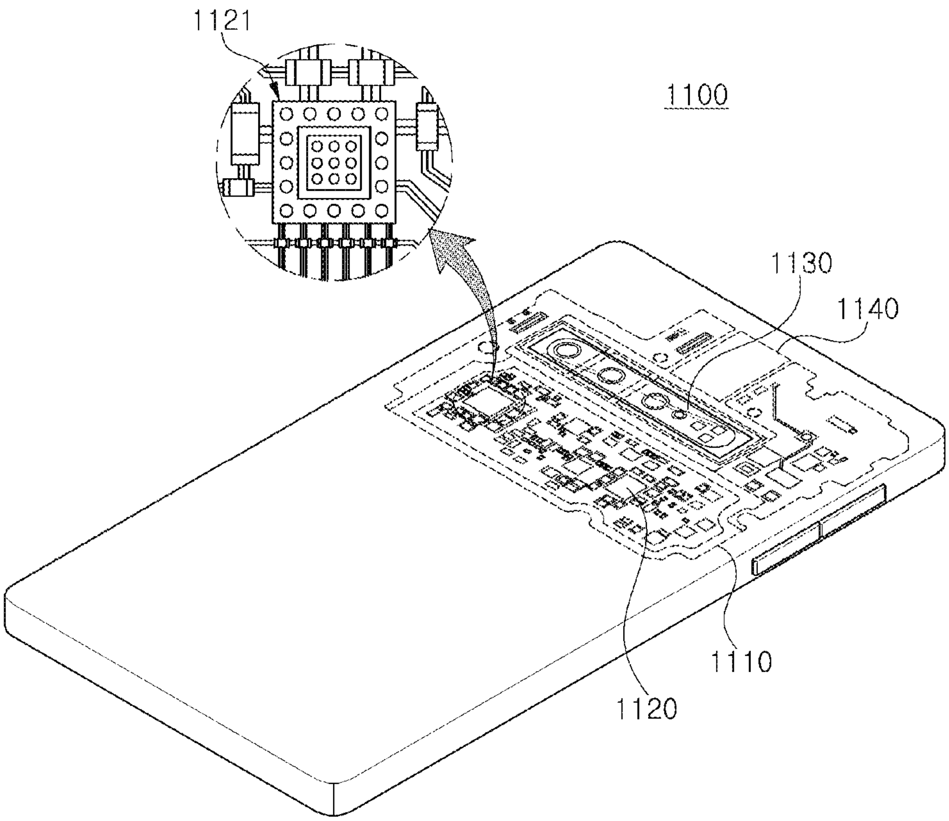
FIG. 2 is a perspective diagram illustrating an example of an electronic device.

FIG. 2 is a perspective diagram illustrating an example of an electronic device.

Referring to FIG. 2, an electronic device may be a smartphone 1100. A motherboard 1110 may be accommodated in the smartphone 1100, and various components 1120 may be physically or electrically connected to the motherboard 1110. Also, other components which may or may not be physically or electrically connected to the motherboard 1110, such as a camera module 1130, may be accommodated in the body 1101. A portion of the components 1120 may be the chip related components, such as, for example, a component package 1121, but an example embodiment thereof is not limited thereto. The component package 1121 may have the form of a printed circuit board on which electronic components including active components and/or passive components are surface-mounted. Alternatively, the component package 1121 may be configured in the form of a printed circuit board in which active components and/or passive components are buried. The electronic device is not necessarily limited to the smartphone 1100, and may be other electronic devices as described above.

Printed Circuit Board

Figure 3:
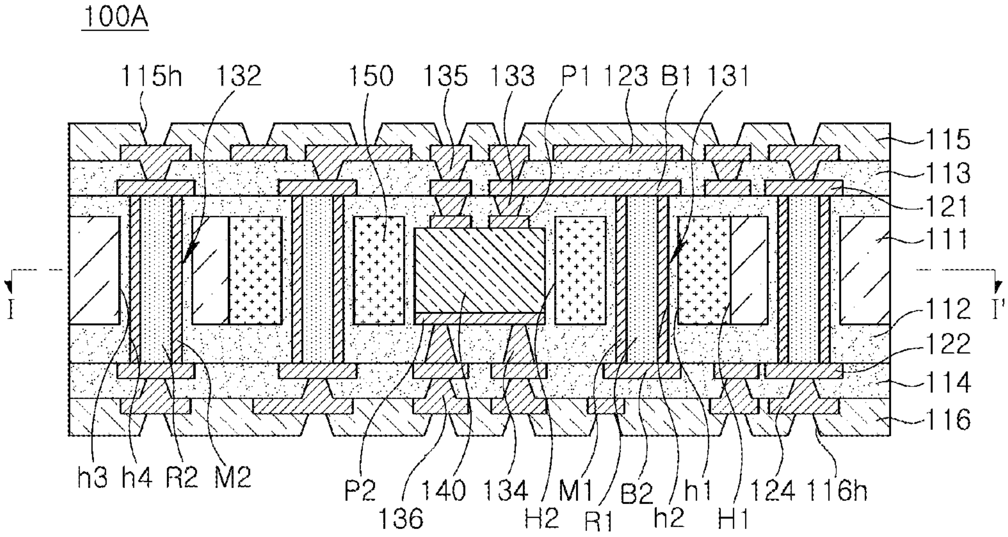
FIG. 3 is a cross-sectional diagram illustrating an example of a printed circuit board.

FIG. 3 is a cross-sectional diagram illustrating an example of a printed circuit board.

Figure 4:
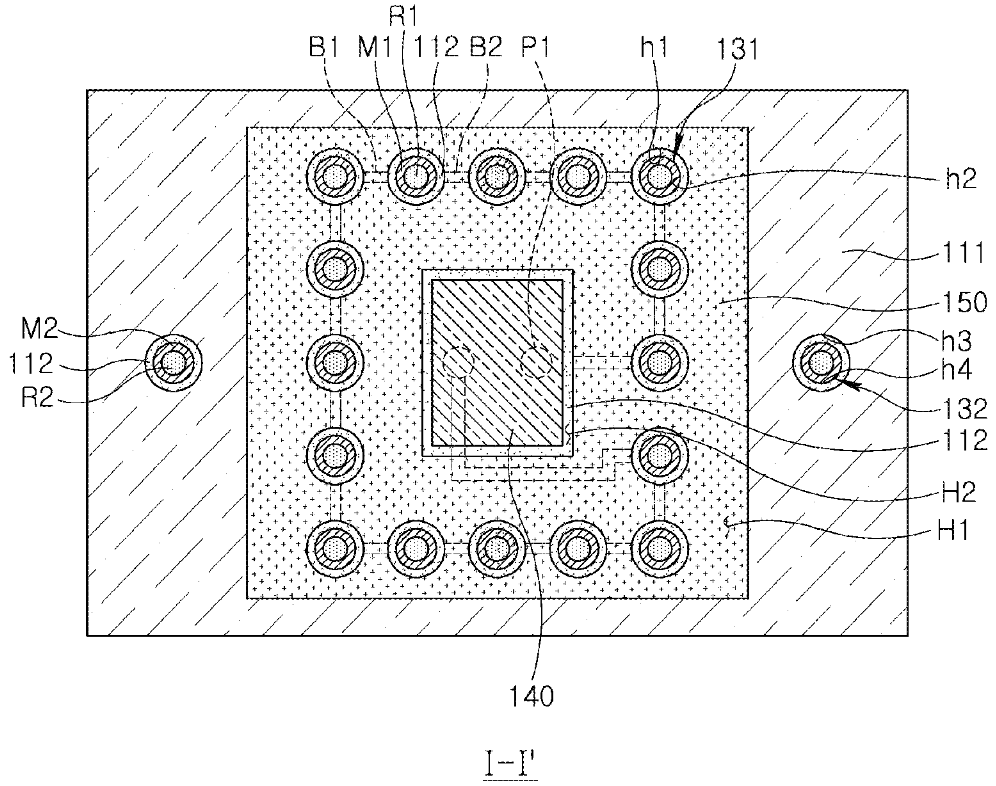
FIG. 4 is a plan cross-sectional diagram taken along line I-I' in FIG. 3.

FIG. 4 is a plan cross-sectional diagram taken along line I-I' in FIG. 3.

Referring to the drawing, a printed circuit board 100A according to an example embodiment may include a substrate 111, a first through-portion H1 penetrating a region between an upper surface and a lower surface of the substrate 111, a magnetic layer 150 disposed in the first through-portion H1, a second through-portion H2 penetrating between upper and lower surfaces of the magnetic layer 150, an electronic component 140 of which at least a portion is disposed within the second through-portion H2, a first through-hole H1 penetrating between upper and lower surfaces of the magnetic layer 150, a first insulating layer 112 disposed on the substrate 111, covering the magnetic layer 150 and the electronic component 140, and filling at least a portion of each of the second through-portion H2 and the first through-hole H1, a second through-hole h2 penetrating between upper and lower surfaces of the first insulating layer 112 within the first through-hole H1, a first wiring pattern B1 disposed on an upper surface of magnetic layer 150, an second wiring pattern B2 disposed on a lower surface of magnetic layer 150, and a first through-via 131 of which at least a portion is disposed in the second through-hole H2 and is surrounded by the magnetic layer 150, and including a first via pattern M1 connecting the first and second wiring pattern B1 and B2 to each other. An inductor may be disposed on the substrate 111 through the magnetic layer 150 and the first through-via 131 including the first and second wiring patterns B1 and B2 and the first via pattern M1 connected to each other to surround at least a portion of the magnetic layer 150. The first insulating layer 112 may be disposed between the upper and lower surfaces of the first and second wiring patterns B1 and B2 and the magnetic layer 150. The first via pattern M1 may be disposed on a wall surface of the second through-hole H2, and the first through-via 131 may include a first filler R1 filling at least a portion of a space between the first via patterns M1 in the second through-hole H2. The second through-hole H2 may be filled with the first via pattern M1 without the first filler R1.

As described above, in the printed circuit board 100A according to an example embodiment, the magnetic layer 150 may be disposed on the first through-portion H1 of the substrate 111, which is core layer, and the first through-via 131 may be formed in the magnetic layer 150, thereby forming an inductor surrounding the magnetic layer 150. Also, by disposing the electronic component 140 in the second through-portion H2 of the magnetic layer 150, a structure in which the electronic component 140 is embedded together with the inductor may be obtained. In this case, a distance between the electronic component 140 and the inductor may be reduced, and a spatial arrangement in the substrate 111 may be efficient. Also, IR drop and power loss may be reduced, and inductance may be improved. Also, slimming and integration may be increased. A plurality of the first and second through-holes H1 and h2 may be formed, and accordingly, a plurality of the first through-vias 131 may be formed. For example, the inductor may include a plurality of first via pattern M1 and a plurality of first and second wiring patterns B1 and B2. For example, the inductor may include one or more coil portions in which the plurality of first and second wiring patterns B1 and B2 and the plurality of first via pattern M1 are alternately connected to each other. In this case, the coil portion may be disposed to surround the electronic component 140 on a plane. Accordingly, the above-mentioned effects may be implemented effectively. Also, the magnetic layer 150 may be disposed on the first through-portion H1 of the substrate 111 and may be covered with the first insulating layer 112, such that metal oxide contained in the magnetic layer 150 may not be exposed to a surface, and the magnetic layer 150 may be prevented from dissolving into an acid solution.

The printed circuit board 100A according to an example embodiment may further include a third through-hole h3 penetrating a region between the upper and lower surfaces of the substrate 111 and having at least a portion filled with the first insulating layer 112, a fourth through-hole h4 penetrating a region between upper and lower surfaces of the first insulating layer 112 within the third through-hole h3, a first wiring layer 121 disposed on an upper surface of the first insulating layer 112 and including the first wiring pattern B1, a second wiring layer 122 disposed on a lower surface of the first insulating layer 112 and including the second wiring pattern B2, and a second through-via 132 having at least a portion disposed in the fourth through-hole h4 and is surrounded by the substrate 111, and including a second via pattern M2 connecting the first and second wiring layers 121 and 122 to each other. The second via pattern M2 may be disposed on a wall surface of the fourth through-hole h4, and the through-via 132 may include a second filler R2 filling at least a portion of a space between the second via patterns M2 in the fourth through-hole h4. If desired, the third through-hole h3 may not be provided, and the fourth through-hole h4 may directly penetrate the substrate 111 without the third through-hole h3. If desired, the fourth through-hole h4 may be filled with the second via pattern M2 without the second filler R2. As described above, the first and second wiring layers 121 and 122 may be disposed on an upper surface and lower surface of the first insulating layer 112 such that various wiring designs may be implemented. Also, by forming the second through-via 132 together when the first through-via 131 is formed, a process may be further simplified and cost and time may be reduced.

The printed circuit board 100A according to an example embodiment may include a first via layer 133 penetrating an upper side of the first insulating layer 112 and including a first connection via connecting the first wiring layer 121 to the first connection pad P1 of the electronic component 140, and a second via layer 134 penetrating a lower side of the first insulating layer 112 and including a second connection via connecting the second wiring layer 122 to a back surface of the electronic component 140, for example, the second connection pad P2 disposed on the back surface of the electronic component 140. As described above, the electronic component 140 may be electrically connected to the above-described inductor through the first via layer 133 and the first wiring layer 121. Also, the electronic component 140 may have an excellent heat dissipation effect through the second via layer 134 and the second wiring layer 122.

The printed circuit board 100A according to an example embodiment may include a second insulating layer 113 disposed on an upper surface of the first insulating layer 112, a third insulating layer 114 disposed on a lower surface of the first insulating layer 112, a third wiring layer 123 disposed on an upper surface of the second insulating layer 113, a fourth wiring layer 124 disposed on a lower surface of third insulating layer 114, a third via layer 135 including a third connection via penetrating the second insulating layer 113 and connecting the first and third wiring layers 121 and 123 to each other, a fourth via layer 136 including a fourth connection via penetrating the third insulating layer 114 and connecting the second and fourth wiring layers 122 and 124 to each other, a first resist layer 115 including a first opening 115*h* disposed on an upper surface of the second insulating layer 113 and exposing at least a portion of the third wiring layer 123, and a second resist layer 116 including a second opening 116*h* disposed on a lower surface of the third insulating layer 114 and exposing at least a portion of the fourth wiring layer 124. As described above, a multilayer package substrate implemented through a build-up process may be obtained.

Hereinafter, components of the printed circuit board 100A according to an example embodiment may be described in greater detail with reference to the drawings.

The substrate 111 may be configured as a core layer. For example, an organic core layer, a glass core layer, a metal core layer, a silicon core layer, or a ceramic core layer may be included. The organic core layer may include an organic insulating material. The organic insulating material may include a thermosetting resin such as an epoxy resin, a thermoplastic resin such as polyimide, or a material including an inorganic filler, an organic filler, and/or glass fiber (glass cloth, glass fabric) along with resin. For example, the organic insulating material may be a non-photosensitive insulating material such as copper clad laminate (CCL), Ajinomoto build-up film (ABF), or prepreg (PPG), but an example embodiment thereof is not limited thereto, and other polymer materials may be used. The glass core layer may include glass. Glass may include, for example, pure silicon dioxide (about 100% SiO2) soda lime glass, borosilicate glass, alumino-silicate glass, or the like. However, but an example embodiment thereof is not limited thereto, and an alternative glass material, such as fluorine glass, phosphate glass, chalcogen glass, or the like, may also be used as a material for the glass layer. Also, other additives may be further included to form glass with specific physical properties. The additives may include calcium carbonate (e.g. lime) and sodium carbonate (e.g. soda), and also magnesium, calcium, manganese, aluminum, lead, boron, iron, chromium, potassium, sulfur and antimony, and carbonate and/or oxide of these elements and other elements. Glass may be distinguished from glass fiber described above. The metal core layer may include metal. The metal may include, for example, copper (Cu), Invar, or the like, but an example embodiment thereof is not limited thereto. The silicon core layer may include pure silicon (Si). If desired, the silicon core layer may include an oxide layer formed on silicon (Si). Also, a nitride layer formed on the oxide layer may be included. The oxide layer may include a silicon oxide film, and the nitride layer may include a silicon nitride film, but an example embodiment thereof is not limited thereto. The ceramic core layer may include ceramic material. A ceramic material may include, for example, alumina ($Al_2O_3$) aluminum nitride (AlN), silicon carbide (SiC), silicon nitride (Si3N4), or the like, but an example embodiment thereof is not limited thereto.

The first to third insulating layers 112, 113, and 114 may include an organic insulating material. As described above, the organic material may include a thermosetting resin such as an epoxy resin, a thermoplastic resin such as polyimide, or a material including an inorganic filler, an organic filler, and/or glass fiber (glass cloth, glass fabric) along with a resin. For example, the organic insulating material may be a non-photosensitive insulating material such as copper clad laminate (CCL), Ajinomoto build-up film (ABF), or prepreg (PPG), but an example embodiment thereof is not limited thereto, and other polymer materials may be used. The first to third insulating layers 112, 113, and 114 may include the same or different organic insulating materials. The first to third insulating layers 112, 113, and 114 may be configured as the plurality of layers, if desired.

The first and second resist layers 115 and 116 may include a liquid or film-type solder resist, but an example embodiment thereof is not limited thereto, and may include other an organic insulating material such as ABF. The first and second resist layers 115 and 116 may have first and second openings 115*h* and 116*h*, respectively. A plurality of the first and second opening 115*h* and 116*h* may be provided. The first and second openings 115*h* and 116*h* may be formed as solder mask defined (SMD) and/or non-solder mask defined (NSMD). The first and second openings 115*h* and 116*h* may expose the third and fourth wiring layers 123 and 124, respectively, and a surface treatment layer may be disposed on a surface of the exposed pattern. The surface treatment layer may be formed by electrolytic gold plating, electroless gold plating, organic solderability preservative (OSP) or electroless tin electroless plating, silver plating, electroless nickel plating/substituted gold plating, direct immersion gold (DIG) plating, hot air solder leveling (HASL), or the like, but an example embodiment thereof is not limited thereto.

Each of the first to fourth wiring layers 121 and 122, 123, and 124 may include a metal layer. The metal layer may include copper (Cu), aluminum (Al), silver (Ag), tin (Sn), gold (Au), nickel (Ni), lead (Pb), titanium (Ti), and/or alloys thereof, or the like. Preferably, copper (Cu) may be included, but an example embodiment thereof is not limited thereto. Each of the first to fourth wiring layers 121 and 122, 123, and 124 may perform various functions depending on a design. For example, a signal pattern, a power pattern, a ground pattern, or the like, may be included. Each of these patterns may have various forms such as a line, a plane, and a pad. The first to fourth wiring layers 121 and 122, 123, and 124 may include a seed layer and a metal layer formed on the seed layer. The seed layer may be configured as an electroless metal layer (or chemical copper) and/or a sputtering layer, and the metal layer may be configured as an electrolytic metal layer (or electrical copper), but an example embodiment thereof is not limited thereto.

The first and second wiring patterns B1 and B2 and the first and second via patterns M1 and M2 may include a metal layer. As described above, the metal layer may include copper (Cu), aluminum (Al), silver (Ag), tin (Sn), gold (Au), nickel (Ni), lead (Pb), titanium (Ti), and/or alloys thereof, or the like. Preferably, copper (Cu) may be included, but an example embodiment thereof is not limited thereto. The second via pattern M2 may perform various functions depending on a design. For example, a signal via pattern, a power via pattern, and a ground via pattern may be included. The first and second wiring patterns B1 and B2 and the first and second via patterns M1 and M2 may include a seed layer and a metal layer formed on the seed layer. The seed layer may be an electroless metal layer (or chemical copper) and/or a sputtering layer, and the metal layer may be an electrolytic metal layer (or electrical copper), but an example embodiment thereof is not limited thereto.

The first and second fillers R1 and R2 may include a plugging material. The plugging material may include an insulating ink including an insulating resin such as epoxy. However, but an example embodiment thereof is not limited thereto, and if desired, conductive ink may be included. The first and second fillers R1 and R2 may be formed through the same process and may thus include the same material, but an example embodiment thereof is not limited thereto.

A plurality of the first through-holes H1 and a plurality of the second through-hole h2 may be formed. For example, on a plane, each of the second through-holes H2 having a diameter smaller than that of the first through-hole H1 may be formed in each of the first through-holes H1. Accordingly, a plurality of the first through-vias 131 may be provided. For example, an inductor may include a plurality of first via pattern M1. A plurality of first wiring pattern B1 and a plurality of second wiring pattern B2 connected to the first via pattern M1 may be provided. The plurality of first and second wiring patterns B1 and B2 may be included in the first and second wiring pattern layers, respectively. The first and second wiring pattern layers may be included in the first and second wiring layers 121 and 122, respectively. A plurality of the third through-hole h3 and a plurality of the fourth through-hole h4 may be formed. For example, on a plane, the fourth through-hole h4 having a diameter smaller than that of the third through-hole h3 may be formed in each of the third through-holes h3. Accordingly, a plurality of the second through-vias 132 may be provided. If desired, the third through-hole h3 may not be provided and only a fourth through-hole h4 may be formed.

Each of the first to fourth via layers 133 and 134, 135, and 136 may include a metal layer. As described above, the metal layer may include copper (Cu), aluminum (Al), silver (Ag), tin (Sn), gold (Au), nickel (Ni), lead (Pb), titanium (Ti), and/or alloys thereof, or the like. Preferably, copper (Cu) may be included, but an example embodiment thereof is not limited thereto. Each of the first to fourth via layers 133 and 134, 135, and 136 may include a filed via filling the via hole, and may also include a conformal via disposed along a wall surface of the via hole. The first to fourth via layers 133 and 134, 135, and 136 may perform various functions depending on a design. For example, a ground via, a power via, a signal via, or the like, may be included. The first and second via layers 133 and 134 may include first and second connection vias tapered in opposite directions, respectively. The third and fourth via layers 135 and 136 may include tapered third and fourth connection vias in opposite directions, respectively. Each of the first to fourth via layers 133 and 134, 135, and 136 may include an electroless metal layer (or chemical copper) and an electrolytic metal layer for electrical copper). A sputtering layer may be included instead of an electroless metal layer (or chemical copper), or both may be included.

The electronic component 140 may be configured as a chip-type electronic component. For example, the electronic component 140 may be configured as a semiconductor chip, and may be an integrated circuit (IC) die in which hundreds to millions of elements are integrated into one chip more specifically. The integrated circuit die may be formed based on an active wafer, and in this case, silicon (Si), germanium (Ge), gallium arsenide (GaAs), or the like, may be used as a base material for each body. Various circuits may be formed in the body. A first connection pad P1 may be formed on a front surface of the body to connect to an external circuit, such as a signal, electricity, ground, or the like, and the first connection pad P1 may include a conductive material such as aluminum (Al) or copper (Cu). If desired, a second connection pad P2 of conductive material connected to ground or power may be formed on a back surface of the body. The electronic component 140 may include a circuit for adjusting voltage. For example, the electronic component 140 may include a voltage regulator. If desired, a plurality of electronic components 140 may be provided, and the plurality of electronic component 140 disposed together in the second through-portion H2, and a plurality of the second through-portions H2 may be formed and may be disposed therein.

The magnetic layer 150 may include a magnetic material. The magnetic material may include, for example, ferrite-based material, permalloy-based material, or the like. For example, Ni-based ferrite, Ni—Zn-based ferrite, Ni—Zn—Cu-based ferrite, Fe—Si—Al (Sendust), Ni—Mo—Fe (MPP: molypermalloy powder core), Ni—Fe (high flux core), or the like, may be included but an example embodiment thereof is not limited thereto, and may also include other generally used materials, such as a ferrite material or a permalloy-based material. Also, various types of magnetic materials including other magnetic powder may be used. The magnetic material may be used as paste or a composition to fill the first through-portion H1 and may be cured to form the magnetic layer 150. Accordingly, the magnetic layer 150 may be in contact with a wall surface of the first through-portion H1. For example, the magnetic layer 150 may be in contact with the substrate 111.

FIGS. 5 to 12 are cross-sectional diagrams illustrating an example of manufacturing the printed circuit board in FIG. 3.

Figure 5:
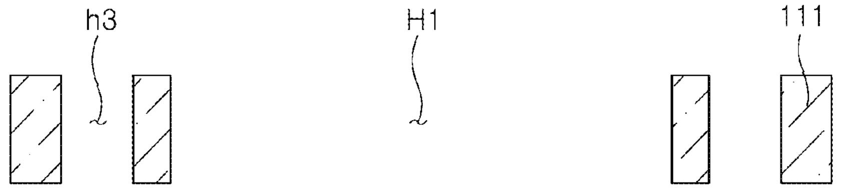
FIGS. 5 to 12 are cross-sectional diagrams illustrating an example of manufacturing the printed circuit board in FIG. 3.

Referring to FIG. 5, the first through-portion H1 may be formed on the substrate 111. Also, a third through-hole h3 may be formed on the substrate 111. The first through-portion H1 and the third through-hole h3 may be formed by various methods such as laser drilling, mechanical drilling, chemical etching, and blasting process, depending on a material of substrate 111. Meanwhile, if desired, the third through-hole h3 may not be provided. For example, the third through-hole h3 may not be formed.

Figure 6:
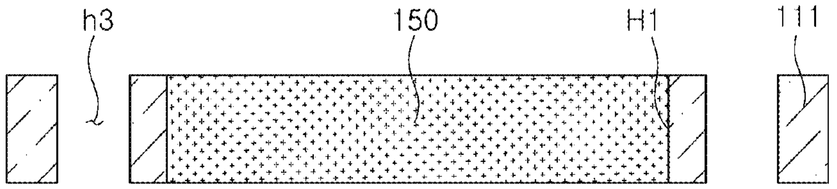

Referring to FIG. 6, the magnetic layer 150 may be formed by filling the first through-portion H1 using magnetic paste or magnetic composition and curing the paste.

Figure 7:
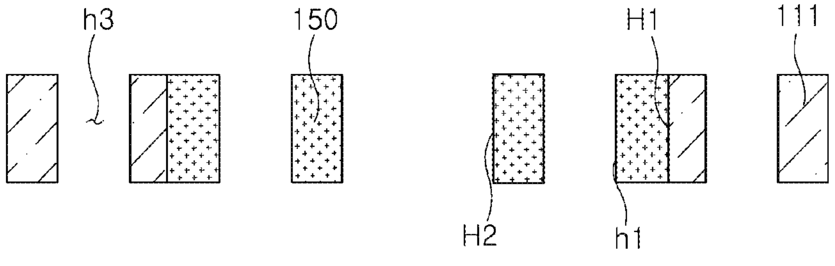

Referring to FIG. 7, the second through-portion H2 may be formed in the magnetic layer 150. Also, the first through-hole H1 may be formed in the magnetic layer 150. The second through-portion H2 and the first through-hole H1 may be formed by mechanical drilling, or the like.

Figure 8:
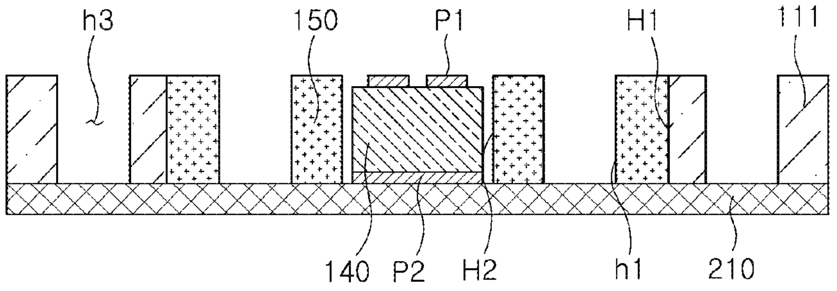

Referring to FIG. 8, the electronic component 140 may be disposed in the second through-portion H2. A tape 210 may be used in disposing of the electronic component 140.

Figure 9:
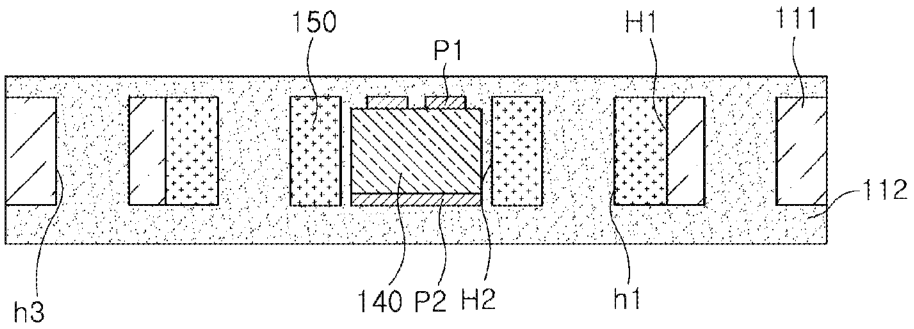

Referring to FIG. 9, the first insulating layer 112 may be formed. For example, by laminating the first insulating layer 112 using a lamination process such as PPG or ABF, at least a portion of each of the substrate 111, the magnetic layer 150, and the electronic component 140 may be covered, and at least a portion of each of the second through-portion H2 and the first and third through-holes H1 and H3. Thereafter, the laminate may be cut into unit sizes through a trimming process, as needed.

Figure 10:
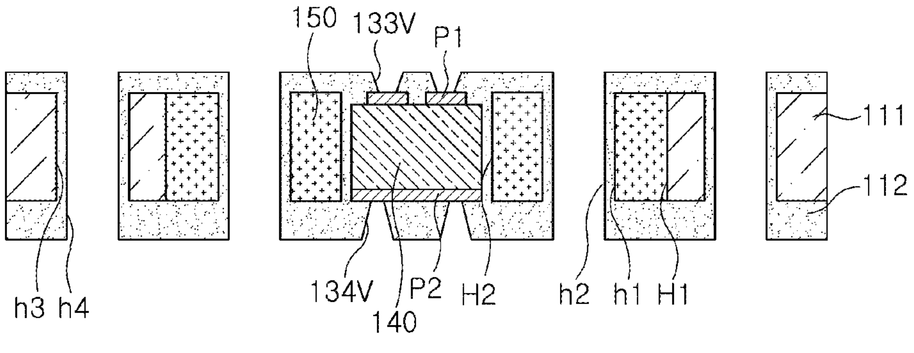

Referring to FIG. 10, the second and fourth through-holes h2 and h4 may be formed in the first and third through-holes H1 and h3, respectively. The second and fourth through-holes h2 and h4 may be formed by a mechanical drill, or the like. Also, first and second via holes 133V and 134V for forming the first and second via layers 133 and 134 may be formed in the first insulating layer 112 through laser processing, or the like. Meanwhile, if desired, the fourth through-hole h4 may be formed without the third through-hole h3. For example, the fourth through-hole h4 may directly penetrate the substrate 111 without the third through-hole h3.

Figure 11:
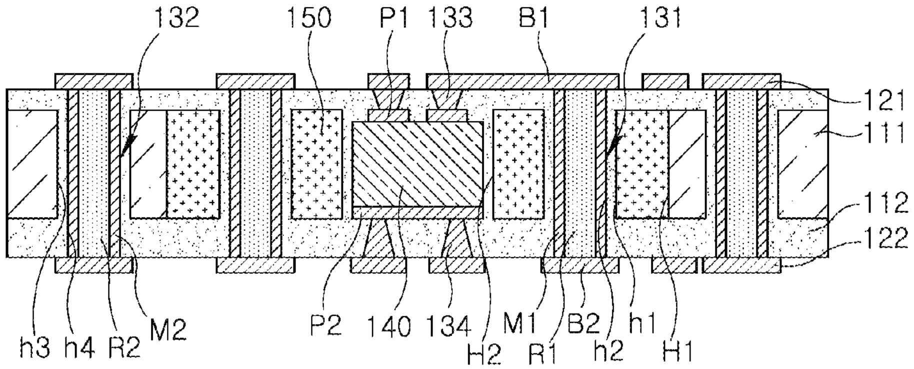

Referring to FIG. 11, through a plating process and a plugging process, the first and second via patterns M1 and M2, the first and second fillers R1 and R2, the first and second wiring patterns B1 and B2, the first and second wiring layer 121 and 122 and the first and second via layers 133 and 134 may be formed. For example, a metal layer may be formed through a plating process on an upper surface and a lower surface of the first insulating layer 112 and a wall surface of the second and fourth through-holes h2 and h4, the second and fourth through-holes h2 and h4 may be filled with a plugging material through the plugging process, the metal layer and the plugging material on the upper and lower surfaces of the first insulating layer 112 may be removed through a planarization process, a metal layer may be formed again through a plating process on the upper and lower surfaces of the first insulating layer 112, and first and second through-vias 131 and 132, first and second wiring layers 121 and 122, and first and second via layers 133 and 134 may be formed. Meanwhile, in the plating process, a metal layer patterned according to a design may be formed using a dry film exposure and development process. Also, through the planarization process, the upper surface and the lower surface of the first insulating layer 112 may be substantially coplanar with each other, and a boundary may be formed between metal layers.

Figure 12:
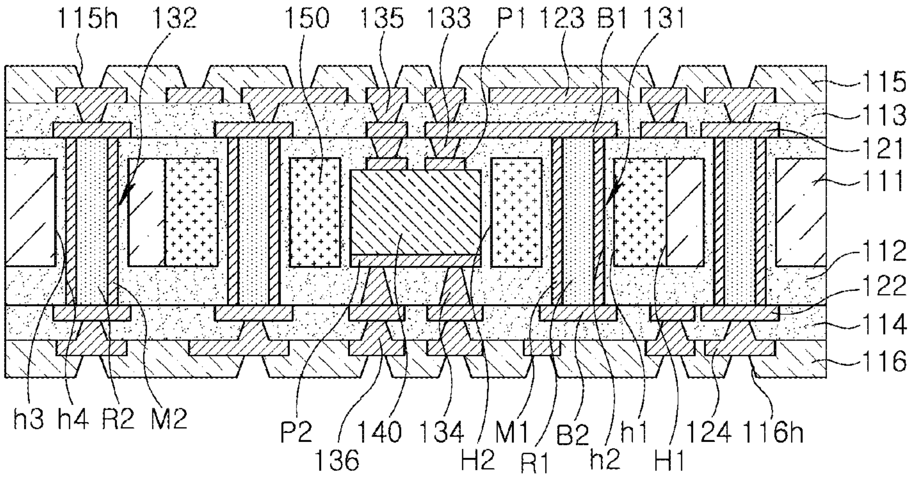

Referring to FIG. 12, through a build-up process, a required number of the second and third insulating layers 113 and 114, the third and fourth wiring layers 123 and 124, and the third and fourth via layers 135 and 136 may be formed, and the first and second resist layers 115 and 116 may be formed. Also, the first and second openings 115*h* and 116*h* may be formed in the first and second resist layers 115 and 116, respectively. The second and third insulating layers 113 and 114 may be formed using a lamination process described above, the third and fourth wiring layers 123 and 124 and the third and fourth via layers 135 and 136 may be formed using the plating process described above, and the first and second resist layers 115 and 116 may be formed through a lamination process or a liquid material coating process.

The printed circuit board 100A according to another example described above may be manufactured through a series of processes, and other descriptions may be substantially the same as the example described above.

Figure 13:
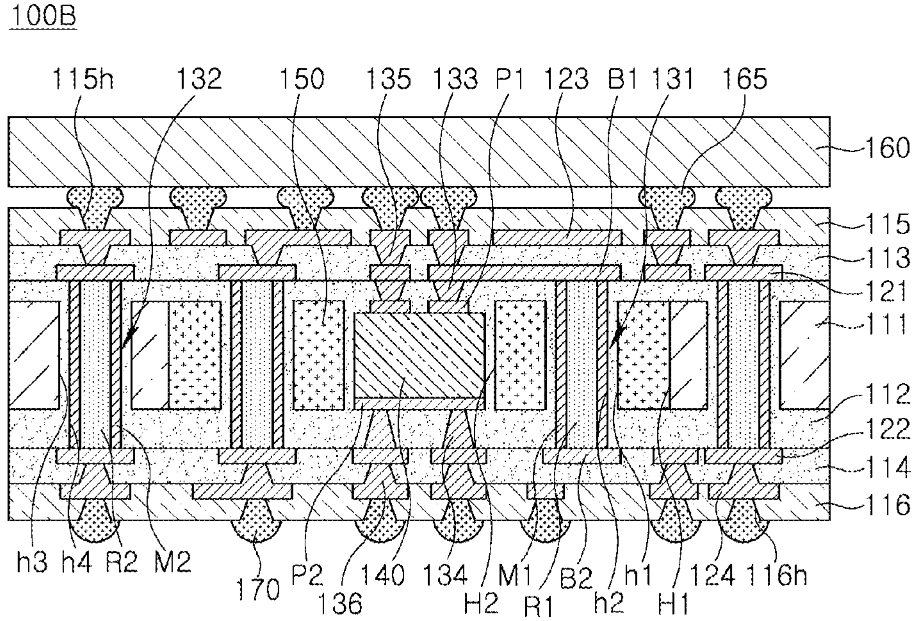
FIG. 13 is a cross-sectional diagram illustrating another example of a printed circuit board.

FIG. 13 is a cross-sectional diagram illustrating another example of a printed circuit board.

Referring to the drawings, the printed circuit board 100B according to another example may further include a semiconductor chip 160 disposed on the first resist layer 115 in the printed circuit board 100A according to the above-described example. Also, a plurality of electrical connection metals 170 disposed on the second resist layer 116 may be included. The semiconductor chip 160 may be mounted through the connection member 165. For example, the semiconductor chip 160 may be connected to the third wiring layer 123 through the connection member 165. The semiconductor chip 160 may be electrically connected to at least a portion of each of the first to fourth wiring layers 121, 122, 123, and 124, first and second through-vias 131 and 132, and first to fourth via layers 133 and 134, 135, and 136. Accordingly, the components may be electrically connected to an inductor and the electronic component 140.

The semiconductor chip 160 may include an integrated circuit (IC) die in which hundreds to millions of elements are integrated into one chip. In this case, the integrated circuit may be configured as, for example, a logic chip such as a central processor (e.g., CPU), graphics processor (e.g., GPU), field programmable gate array (FPGA), digital signal processor, cryptographic processor, microprocessor, microcontroller, application processor, (e.g., AP), an analog-to-digital converter, or an application-specific IC (ASIC), but an example embodiment thereof is not limited thereto, and the integrated circuit may be configured as a memory chip such as volatile memory (e.g. DRAM), non-volatile memory (e.g. ROM), flash memory, High Bandwidth Memory (HBM), or other types such as power management IC (PMIC). The semiconductor chip 160 may be formed based on an active wafer, and in this case, silicon (Si), germanium (Ge), gallium arsenide (GaAs), or the like, may be used as a base material for each body. Various circuits may be formed in the body. A connection pad may be formed on the body, and the connection pad may include a conductive material such as aluminum (Al) or copper (Cu). The semiconductor chip 160 may be configured as a bare die, and in this case, a metal bump may be disposed on the connection pad. The semiconductor chip 160 may be configured as a packaged die, and in this case, an additional redistribution layer may be formed on the connection pad, and a metal bump may be disposed on the redistribution layer.

The connection member 165 may mount the semiconductor chip 160 on a package substrate. The connection member 165 may be formed of a low melting point metal, for example, solder such as tin (Sn)-aluminum (Al)-copper (Cu), but an example embodiment thereof is not limited thereto. The connection member 165 may be a ball, pin, or the like. The connection member 165 may be formed as multiple layers or single layer. When formed as multiple layers, a copper pillar and solder may be included, and when formed as a single layer, tin-silver solder may be included, but an example embodiment thereof is not limited thereto. A plurality of connection members 165 may be provided, and the number of the connection members 165 is not limited to any particular example.

The electrical connection metal 170 may connect the printed circuit board 100B to a main board or other substrate of an electronic device. The electrical connection metal 170 may be formed of a low melting point metal, for example, solder, or the like, but an example embodiment thereof is not limited thereto and the material is not limited to thereto. The electrical connection metal 170 may be a ball, pin, or the like. The electrical connection metal 170 may be formed as multiple layers or single layer. When formed as a multilayer, copper pillar and solder may be included, and when formed as a single layer, tin-silver solder or copper may be included, but an example embodiment thereof is not limited thereto. A plurality of the electrical connection metals 170 may be included, and the number of the electrical connection metals 170 is not limited to any particular example.

Other descriptions may be substantially the same as that of the example described in the printed circuit board 100A according to the above-mentioned example. Meanwhile, in the printed circuit board 100B according to another example, in a process of manufacturing the printed circuit board 100A according to the above-mentioned example, a semiconductor chip 160 may be further mounted on an upper side using a connection member 165, and the electrical connection metal 170 may be formed on a lower side, and a specific description may not be provided.

Figure 14:
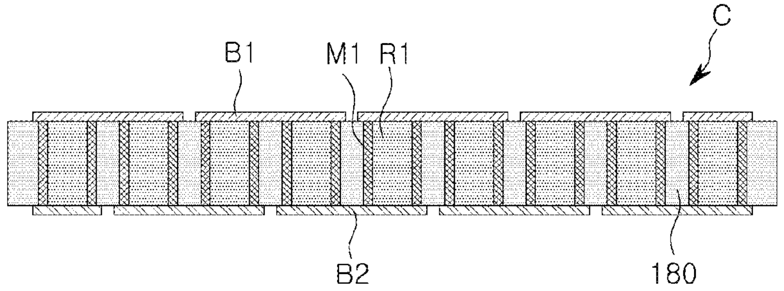
FIG. 14 is a cross-sectional diagram illustrating an example of a coil portion.

FIG. 14 is a cross-sectional diagram illustrating an example of a coil portion.

Referring to the drawings, an inductor included in the above-described printed circuit boards 100A and 100B may include one or more coil portions C, and in the coil portion C, the plurality of first and second wiring patterns B1 and B2 formed in the body 180 and the plurality of first via pattern M1 may be alternately connected to each other. For example, in the coil portion C, on the cross-section, a required number of the second wiring pattern B2, the first via pattern M1, the first wiring pattern B1, the first via pattern M1, the second wiring pattern B2, the first via pattern M1, the first wiring pattern B1, the first via pattern M1 may be connected using the via pattern M1 such that a coil structure alternately formed vertically may be formed. Meanwhile, the body 180 may include the above-described magnetic layer 150 and the first insulating layer 112. Also, the first filler R1 may be filled in each through-hole in which the first via pattern M1 is formed. As described above, the coil portion C may have a structure in which the number of coils surrounding the magnetic layer 150 may be increased, for example, a daisy chain shape which may increase inductance. Other descriptions may be substantially the same as that of the example described in the printed circuit boards 100A and 100B described above, and accordingly, overlapping descriptions may not be provided.

Figure 15:
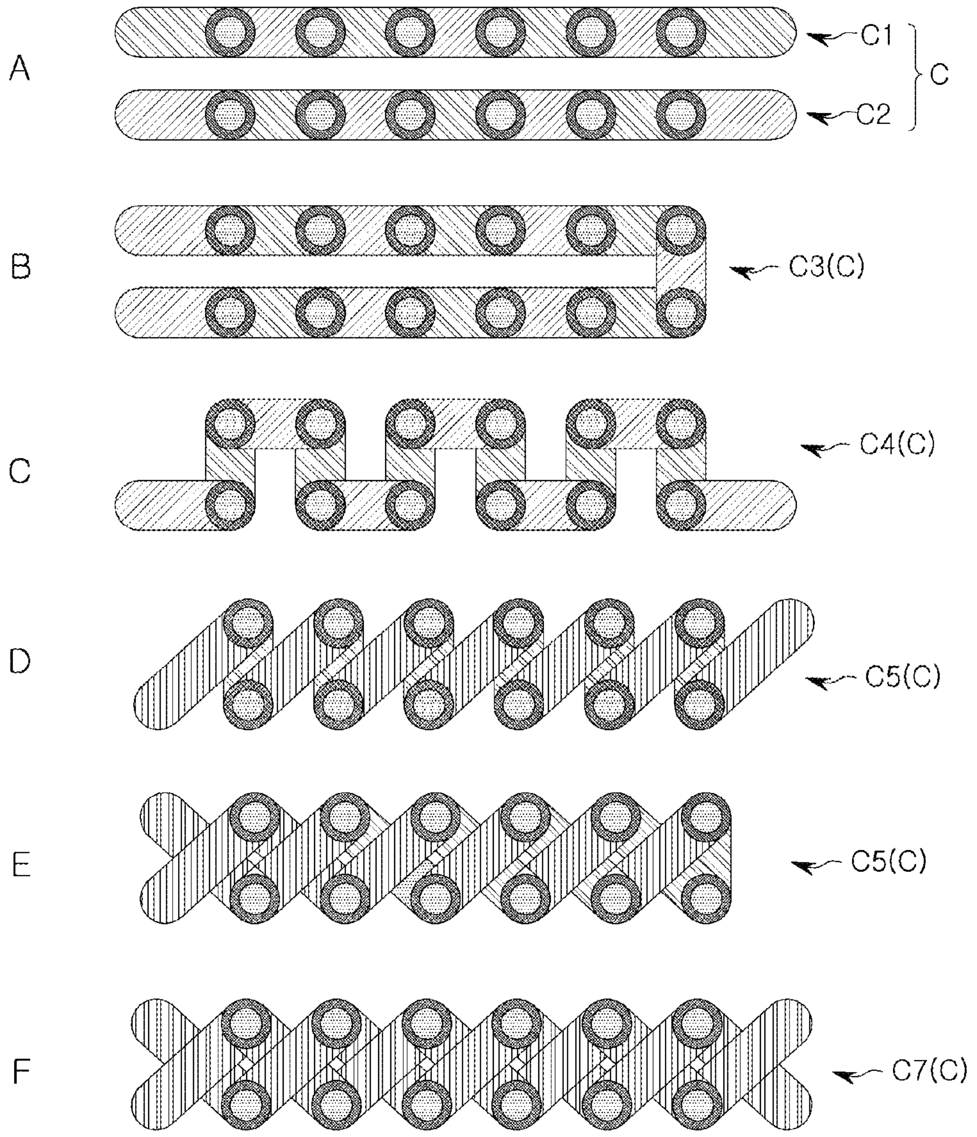
FIG. 15 is a plan diagram illustrating various examples of a coil portion.

FIG. 15 is a plan diagram illustrating various examples of a coil portion.

Referring to the drawings, the coil portion C described above may have various shapes on a plane. For example, as in A, a plurality of coils C1 and C2 arranged in parallel linearly may be included. The plurality of coils C1 and C2 may be spaced apart from each other. Different wirings may be disposed between the plurality of coils C1 and C2. Alternatively, as in B, a coil C3 may be arranged linearly, may be bent on the right and may be arranged linearly. Alternatively, as in C, a coil C4 arranged to be bent upwardly and downwardly repeatedly may be included. Alternatively, as in D, a coil C5 repeatedly arranged in a tilted manner in one direction may be included. Alternatively, as in E, a coil C6 repeatedly arranged to be inclined in one direction, bent to the right and repeatedly arranged to be tilted in the opposite direction may be included. Alternatively, as in F, a coil C7 repeatedly arranged in an X-shape. As described above, the coil portion C including various types of coils C1, C2, C3, C4, C5, C6, and C7 may be applied to the above-described printed circuit boards 100A and 100B, and may be disposed repeatedly to surround the electronic component 140. However, the shape of the coil portion is not limited to the examples described above. The other descriptions may be substantially the same as the example described in a cross-sectional shape of the above-mentioned printed circuit boards 100A and 100B and the coil portion C, and accordingly, overlapping descriptions may not be provided.

In the present disclosure, the term "covering" may include the configuration in which the component is entirely covered and at least a portion of the component is covered, or the component is directly or indirectly covered. Also, the term "fill" may include the configuration in which the component is completely filled, and also at least a portion of the component is filled, and the component is almost filled. For example, a void may be present. Also, the term "surrounding" may include the configuration in which the component is completely surrounded, and is also almost surrounded. Also, the term "exposing" may include the configuration in which the component is completely exposed or a portion thereof is exposed, and the exposing may refer to exposing from the buried component. For example, the configuration in which the opening may expose a pad may include exposing a pad from the resist layer, and a surface treatment layer may be further disposed on the exposed pad.

In the example embodiment, the configuration in which the component is disposed in a through-portion or a through-hole may include the configuration in which the component is completely disposed in the through-portion or through-hole, and also the configuration in which the component partially protrudes to an upper side or a lower side on a cross-section. For example, in the case in which the component is disposed in a through-portion or through-hole on a plane, the configuration may be understood in a broader sense.

According to the aforementioned example embodiments, a printed circuit board which may reduce IR drop and power loss may be provided.

Also, a printed circuit board which may improve inductance may be provided.

Also, a printed circuit boards which may increase size reduction and integration may be provided.

In the example embodiments, the cross-section may refer to a cross-sectional shape when an object is vertically cut, or a cross-sectional shape when the object is viewed from the side. Also, a plane may refer to a planar shape when the object is horizontally cut, or a planar shape when the object is viewed from above or below.

In the present disclosure, the example embodiments may include process errors, positional deviations, and measurement errors occurring in the process. For example, the configuration in which components are substantially the same may include the example in which the components are completely the same, and also the example in which a slight difference due to a process error may be present. Also, the configuration in which elements are substantially constant may include the example in which the elements are completely constant, and also the example in which a minute difference may be generated due to a process error.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in an example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present disclosure as defined by the appended claims.

What is claimed is:

1. A printed circuit board, comprising:
- a substrate with first through-portion;
- a magnetic layer disposed in at least a portion of the first through-portion and having a second through-portion;
- an electronic component having at least a portion disposed in the second through-portion;
- a first wiring pattern disposed on an upper surface of the magnetic layer;
- a second wiring pattern disposed on a lower surface of the magnetic layer; and
- a first through-via having at least a portion surrounded by the magnetic layer, and including a first via pattern connecting the first and second wiring patterns to each other.

2. The printed circuit board of claim 1, wherein the electronic component includes a voltage regulator.

3. The printed circuit board of claim 1, further comprising:
- a first insulating layer covering at least a portion of each of the substrate, the magnetic layer, and the electronic component, and filling at least a portion of the second through-portion.

4. The printed circuit board of claim 3,
- wherein the magnetic layer further has a first through-hole,
- wherein the first insulating layer fills at least a portion of the first through-hole,
- wherein the first insulating layer has a second through-hole in the first through-hole,
- wherein at least a portion of the first through-via is disposed in the second through-hole, and
- wherein the first through-via is spaced apart from the magnetic layer.

5. The printed circuit board of claim 4,
- wherein the first via pattern is disposed on a wall surface of the second through-hole, and
- wherein the first through-via further includes a first filler filling at least a portion of a space between the first via pattern in the second through-hole.

6. The printed circuit board of claim 3, further comprising:
- a first wiring layer disposed on an upper surface of the first insulating layer; and
- a second wiring layer disposed on a lower surface of the first insulating layer,
- wherein the first insulating layer is disposed between the first and second wiring patterns and between upper and lower surfaces of the magnetic layer, and
- wherein the first and second wiring layers include the first and second wiring patterns, respectively.

7. The printed circuit board of claim 6, further comprising:
- a second through-via having at least a portion surrounded by the substrate, and including a second via pattern connecting at least portions of the first and second wiring layers to each other.

8. The printed circuit board of claim 7,
- wherein the substrate further has a third through-hole,
- wherein the first insulating layer fills at least a portion of the third through-hole,
- wherein the first insulating layer has a fourth through-hole in the third through-hole,
- wherein at least a portion of the second through-via is disposed in the fourth through-hole, and
- wherein the second through-via is spaced apart from the substrate.

9. The printed circuit board of claim 8,
- wherein the second via pattern is disposed on a wall surface of the fourth through-hole, and
- wherein the second through-via further includes a second filler filling at least a portion of a space between the second via pattern in the fourth through-hole.

10. The printed circuit board of claim 6, further comprising:

a first via layer penetrating an upper side of the first insulating layer and including a first connection via connecting the first wiring layer to the electronic component, wherein the electronic component and the first via pattern are connected to each other through a path passing through the first connection via and the first wiring layer.

11. The printed circuit board of claim 10, a second via layer penetrating a lower side of the first insulating layer and including a second connection via connecting the second wiring layer to the electronic component, wherein the second connection via is connected to a back surface of the electronic component, and wherein the first and second connection vias are tapered in opposite directions.

12. The printed circuit board of claim 6, further comprising:

a second insulating layer disposed on an upper surface of the first insulating layer;

a third insulating layer disposed on a lower surface of the first insulating layer;

a third wiring layer disposed on an upper surface of the second insulating layer;

a fourth wiring layer disposed on a lower surface of the third insulating layer;

a third via layer penetrating the second insulating layer and including a third connection via connecting the first and third wiring layers to each other; and a fourth via layer penetrating the third insulating layer and including a fourth connection via connecting the second and fourth wiring layers to each other, wherein the third and fourth connection vias are tapered in opposite directions.

13. The printed circuit board of claim 12, further comprising:

a first resist layer disposed on an upper surface of the second insulating layer and having a first opening exposing at least a portion of the third wiring layer; and a second resist layer disposed on a lower surface of the third insulating layer and having a second opening exposing at least a portion of the fourth wiring layer.

14. The printed circuit board of claim 1, wherein the magnetic layer is in contact with a wall surface of the first through-portion.

15. The printed circuit board of claim 1, wherein the substrate includes an organic core layer, a glass core layer, a metal core layer, a silicon core layer, or a ceramic core layer.

16. The printed circuit board of claim 1, wherein the first and second wiring pattern and the first via pattern are connected to each other to surround at least a portion of the magnetic layer, and an inductor is disposed on the substrate.

17. A printed circuit board, comprising:

a substrate having a first through-portion;

a magnetic layer having at least a portion disposed in the first through-portion, in contact with the substrate, and having a second through-portion and a plurality of through-holes;

a voltage regulator disposed in at least a portion of the second through-portion;

an insulating layer covering at least a portion of each of the substrate, the magnetic layer, and the voltage regulator, and filling at least a portion of each of the second through-portion and the plurality of through-holes;

a first wiring pattern layer disposed on an upper surface of the insulating layer;

a second wiring pattern layer disposed on a lower surface of the insulating layer; and a plurality of via patterns penetrating each of the insulating layers in the plurality of through-holes.

18. The printed circuit board of claim 17, wherein the first wiring pattern layer includes a plurality of first wiring patterns, wherein the second wiring pattern layer includes a plurality of second wiring patterns, and wherein the printed circuit board further includes one or more coil portions in which the plurality of first and second wiring patterns and the plurality of via patterns are alternately connected to each other.

19. The printed circuit board of claim 18, wherein the one or more coil portions surround the voltage regulator on a plane.

20. A printed circuit board, comprising:

a substrate with a first through-portion penetrating therethrough in a first direction;

a magnetic layer comprising a magnetic material disposed in the first through-portion, the magnetic layer having a second through-portion penetrating therethrough; and an inductor disposed in the magnetic layer and around the second through-portion, the inductor comprising:

first through-vias penetrating the magnetic layer in a pattern arranged outside the second through-portion in a second direction perpendicular to the first direction, a first wiring pattern disposed on an upper surface of at least the magnetic layer and contacting a top portion of at least some of the first through-vias, and a second wiring pattern disposed on a lower surface of at least the magnetic layer and contacting a bottom portion of at least some of the first through-vias, wherein the first wiring pattern is connected to the second wiring pattern by the first through-vias to form the inductor.

21. The printed circuit board of claim 20, further comprising an electronic component disposed in the second through-portion.

22. The printed circuit board of claim 21, wherein the electronic component is a voltage regulator.

23. The printed circuit board of claim 21, wherein each of the first through-vias is disposed in a corresponding first through-hole penetrating the magnetic layer with a first insulating layer separating that first through-via from inner walls of the corresponding first through-hole.

24. The printed circuit board of claim 23, wherein the first insulating layer covers at least portions of each of the magnetic layer, the substrate and the electronic component and fills at least a portion of the second through-portion.

* * * * *